(12) United States Patent
Konuk et al.

(10) Patent No.: US 6,914,459 B2
(45) Date of Patent: *Jul. 5, 2005

(54) CLOCK MULTIPLIER USING MASKED CONTROL OF CLOCK PULSES

(75) Inventors: Haluk Konuk, Sunnyvale, CA (US); Vincent R. von Kaenel, Palo Alto, CA (US); Dai M. Le, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/857,817

(22) Filed: Jun. 1, 2004

(65) Prior Publication Data

US 2004/0217791 A1 Nov. 4, 2004

Related U.S. Application Data

(63) Continuation of application No. 10/241,070, filed on Sep. 11, 2002, now Pat. No. 6,756,827.

(51) Int. Cl.[7] .............................................. H03B 19/00
(52) U.S. Cl. ...................................... 327/116; 327/291
(58) Field of Search ................. 327/113–116, 117–122, 327/172–175, 291–299, 156–159; 331/1 A, 12–18; 713/600, 601, 500–513; 375/376

(56) References Cited

U.S. PATENT DOCUMENTS

| 5,404,250 A | 4/1995 | Hase et al. .................... 360/51 |
| 5,631,587 A | 5/1997 | Co et al. ...................... 327/107 |
| 5,818,270 A | 10/1998 | Hamza ........................ 327/116 |
| 5,822,387 A | * 10/1998 | Mar ............................ 375/376 |
| 5,886,582 A | * 3/1999 | Stansell ....................... 331/1 A |
| 5,918,043 A | * 6/1999 | Kardach et al. ............. 713/601 |
| 5,922,076 A | 7/1999 | Garde ......................... 713/600 |
| 6,147,525 A | 11/2000 | Mitani et al. ................ 327/119 |
| 6,433,607 B2 | 8/2002 | Kawasaki et al. ........... 327/299 |
| 6,441,660 B1 | 8/2002 | Ingino, Jr. .................. 327/156 |
| 6,509,766 B1 | 1/2003 | Pomichter et al. .......... 327/116 |

\* cited by examiner

*Primary Examiner*—Minh Nguyen
(74) *Attorney, Agent, or Firm*—Garlick Harrison & Markison LLP

(57) ABSTRACT

A clock multiplier circuit receives a clock input signal and generates a clock output signal. The clock multiplier circuit generates a number of pulses to be used as the clock output signal, wherein the pulses have a pulsewidth that is independent of the number of pulses generated and independent of the frequency of the clock input signal. The clock multiplier circuit includes an oscillator and a logic circuit which generates a control signal for synchronization of the pulses to the control signal and to mask the pulses after a selected number of pulses have been output as the clock output signal. The clock multiplier circuit causes a number of unmasked pulses to be output as the clock output signal in response to the control signal, while other pulses are masked.

8 Claims, 7 Drawing Sheets

```
┌─────────────────────────────────────────────────────┐
│          Computer Accessible Medium 300             │
│                                                     │
│              ┌──────────────────┐                   │
│              │ Integrated Circuit│                  │
│              │        10        │                   │
│              └──────────────────┘                   │
│                                                     │
└─────────────────────────────────────────────────────┘
```

Fig. 8

CLOCK MULTIPLIER USING MASKED CONTROL OF CLOCK PULSES

This application is a continuation of and claims priority to U.S. Patent Application having an application Ser. No. 10/241,070, filed Sep. 11, 2002, now U.S. Pat. No. 6,756,827, which application is hereby incorporated by reference.

BACKGROUND OF THE INVENTION

1. Field of the Invention

This invention is related to the field of clocking of integrated circuits and, more particularly, to multiplying the frequency of a clock.

2. Description of the Related Art

Integrated circuits may include clock multiplier circuits. Generally, the clock multiplier circuit in an integrated circuit is used for multiplying the frequency of a clock input (or inputs) to the integrated circuit to generate one or more clocks for internal use within the integrated circuit. The clock multiplier may be used to allow lower frequency clocks to be supplied to the integrated circuit, while still allowing the higher frequency operation within the integrated circuit.

One typical method for building a clock multiplier circuit is using a phase-locked loop (PLL). Generally, a PLL requires a certain amount of time (lock time) to adapt if the input clock frequency is changed during operation or if the multiplier ratio (between the output of the clock multiplier circuit and the input clock signal) is changed during operation. Similarly, if the clock input is stopped, the PLL may require a certain amount of time to stop. If the input clock is restarted, the PLL may require the lock time to restart in a predictable fashion. While a maximum lock time may be specified, the actual lock time may not be predetermined. Variations in lock time may occur due to process parameters in the fabrication process, operating temperature, supply voltage, etc.

In some cases, the lack of determinism in the operation of the PLL may be problematic. For example, during testing of the integrated circuit, determinism in the clocking may be desired in order to generate test results that may be matched with expected results. If the number of clock periods that have elapsed in the integrated circuit is not deterministic, it may be difficult to observe state in the integrated circuit and verify that the state is correct as expected by the test.

SUMMARY OF THE INVENTION

In one embodiment, an integrated circuit includes a clock multiplier circuit and a core configured to be clocked by an output clock signal of the clock multiplier circuit. The clock multiplier circuit is coupled to receive an input signal and is configured to generate an output clock signal. The clock multiplier circuit is configured to generate a number of pulses on the output clock signal responsive to an edge of the input signal, wherein the pulses have a width that is independent of the number of pulses generated and independent of the frequency of the input signal. The number of pulses is selectable.

In another embodiment, a clock multiplier circuit is coupled to supply an output clock signal, and includes a circuit and an oscillator. The circuit is configured to cause a number of pulses on the output clock signal of the clock multiplier circuit responsive to a control signal. The width of each of the pulses is independent of a frequency of the signal and is independent of the number of pulses. The oscillator is configured to generate a stream pulses having the width, wherein the circuit is coupled to receive the stream of pulses.

BRIEF DESCRIPTION OF THE DRAWINGS

The following detailed description makes reference to the accompanying drawings, which are now briefly described.

FIG. 8 is a block diagram of one embodiment of a computer accessible medium.

Figure 1:
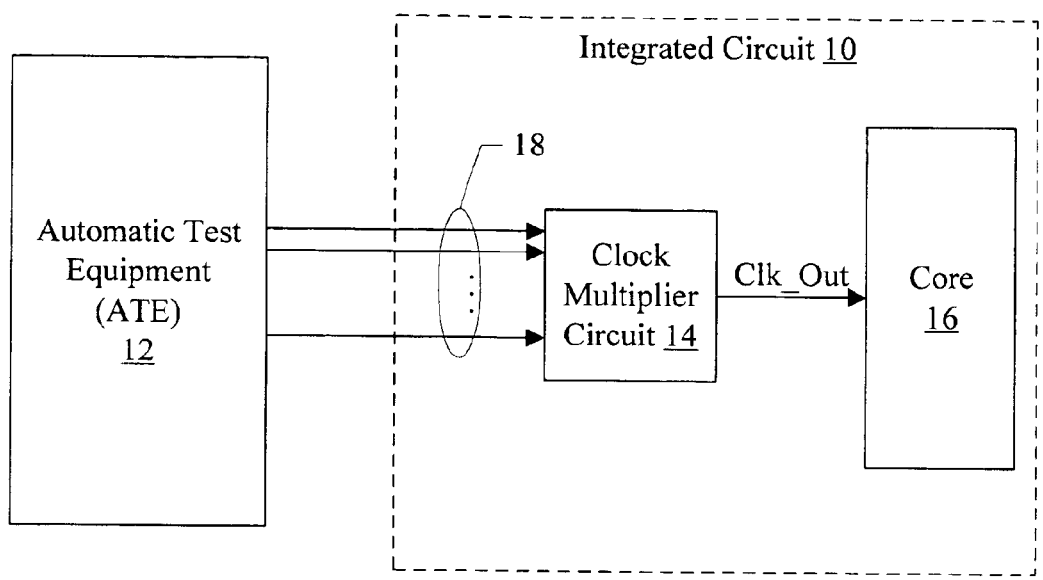
FIG. 1 is a block diagram of one embodiment of an integrated circuit including one embodiment of a clock multiplier circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown coupled to an automatic test equipment (ATE) 12. In the embodiment of FIG. 1, the integrated circuit 10 includes a clock multiplier circuit 14 and a core 16. The core 16 is coupled to receive a clock signal (Clk_Out) from the clock multiplier circuit 14. The clock multiplier circuit 14 is further coupled to one or more input signals 18. The ATE 12 may generate the input signals 18 in the illustrated embodiment.

The input signals 18 may include one or more input clock signals and/or control signals in various embodiments. Generally, the clock multiplier circuit 14 may receive the input signals 18 and may generate the Clk_Out clock signal responsive to the input signals 18.

The ATE 12 may be configured to perform various tests on the integrated circuit 10, to determine if the integrated circuit 10 has any defects, to determine if the integrated circuit 10 is operable at a given clock frequency, etc. Generally, the ATE 12 may communicate with the integrated circuit 10 using various external signals of the integrated circuit 10. In some embodiments, the integrated circuit 10 may include a Joint Test Action Group (JTAG) interface compatible with, e.g., the Institute of Electrical and Electronic Engineers (IEEE) standard 1149.1-1990. The ATE 12 may use the JTAG interface for communicating with the integrated circuit 10. In other embodiments, other test interfaces may be provided for interacting with the integrated circuit 10. Additionally, the ATE 12 may communicate with the integrated circuit 10 using the various functional interfaces of the integrated circuit 10 (those interfaces used for communication by the integrated circuit 10 when it is included in a system with other circuitry).

The ATE 12 may be used to test the integrated circuit 10 at various points in the manufacturing process of the integrated circuit 10. For example, if the integrated circuit 10 has been encapsulated in a package for sale, the ATE 12 may make electrical contact with the pins of the package (e.g. the pins of a pin grid array type package or flat pack type package, the solder balls of a ball grid array type package, etc.) to communicate with the integrated circuit 10. Another point at which an ATE 12 may be used is while the integrated circuit 10 is still part of a wafer of integrated circuits 10. The ATE 12 at this point makes contact directly with the electrical connections which may later be used to connect the integrated circuit 10 to a package (e.g. pads, C4 bumps, etc.).

The ATE 12 may control clocking of the integrated circuit 10 using the signals 18 to communicate with the integrated circuit 10. In some tests, the ATE 12 may vary the frequency of the input clock or clocks included in signals 18 during the test. In some embodiments, the clock multiplier circuit 14 may adapt rapidly to the change of frequency of the input clock signal. In some implementations, the clock multiplier circuit 14 may adapt in the next clock cycle of the input clock signal to the new frequency. In some tests, the ATE 12 may change the multiplier ratio (the ratio of the input clock frequency to the output clock frequency of the clock multiplier circuit 14) during the test. In some embodiments, the clock multiplier circuit 14 may adapt rapidly to the change of multiplier ratio. In some implementations, the clock multiplier circuit 14 may adapt in the next clock cycle of the input clock signal to the new ratio.

In some embodiments, the clock multiplier circuit 14 may be coupled to receive an input clock signal and may be configured to generate, during a period of the input clock signal, a number of pulses on the Clk_Out clock signal. The pulses on the Clk_Out clock signal may have a pulse width that is independent of the input clock frequency and the number of pulses generated during the period. The number of pulses generated may be selectable, and may be set to the desired multiplier ratio. Since there are the number of pulses (indicated by the multiplier ratio) per period of the input clock signal, the frequency of the Clk_Out clock signal may be the frequency of the input clock signal multiplied by the multiplier ratio.

In some embodiments, the clock multiplier circuit 14 is configured to generate the pulses responsive to an edge of the input clock signal (or an input control signal). In various embodiments described in more detail herein, the clock multiplier circuit 14 may generate the pulses responsive to the rising edge of the input clock signal. Other embodiments similar to the described embodiments may generate the pulses responsive to the falling edge of the input clock signal, or both the rising and the falling edges, as desired. Since the pulses are generated responsive to the edge of the input clock signal, a change in the multiplier ratio may become effective in the next input clock period (e.g. responsive to the next rising edge of the input clock signal). Similarly, since the number of pulses is generated per period of the input clock signal in some embodiments, changes in the input clock frequency may result in corresponding changes of the Clk_Out clock signal beginning with the next period of the input clock signal. If the input clock is stopped, no edges occur on the input clock signal and thus no pulses are generated on the Clk_Out clock signal. If the input clock is restarted, the Clk_Out clock signal may restart responsive to the first edge after the restart occurs.

The core 16 may generally include the circuitry which implements the desired functionality of the integrated circuit 10. Thus, in various implementations, the core 16 may include any combination of one or more processors, one or more caches, one or more bridges to I/O devices or interfaces, one or more I/O devices, one or more specialized circuits for performing a specified set of operations, etc. In various embodiments, the core 16 may include various clocked circuit elements, which may use the Clk_Out clock signal as the clock signal (or a clock signal derived from the Clk_Out clock signal, e.g. by dividing or multiplying the frequency of the Clk_Out clock signal). While one output clock signal is shown, other embodiments may output multiple clock signals (e.g. with different multiplication ratios) for use in the core 16. Such embodiments may include multiple instantiations of the embodiments shown in FIGS. 2, 4, and 6, for example, to generate the multiple output clock signals (although some circuit elements may be shared, such as the oscillators in FIGS. 2 and 4). As used herein, a clock multiplier circuit includes any circuit which receives at least one input signal and generates at least one output clock signal having a frequency which is a multiple of the frequency of the input signal.

A pulse on a signal may generally include a first transition on the signal (e.g. from high to low or from low to high) followed by a second transition in the opposite direction of the first transition. The width of a pulse may be the amount of time elapsing between the first transition and the second transition.

It is noted that, while the clock multiplier circuit 14 is shown in FIG. 1 in a test configuration, the clock multiplier circuit 14 may, in some embodiments, supply the clock signal or signals to the core 16 during normal operation as well. In other embodiments, separate clock generation circuitry (not shown) may be included in parallel with the clock multiplier circuit 14 and the clock to the core 16 may be selected from the clock multiplier circuit 14 or the clock generation circuit by selection circuitry based on whether or not testing is being performed.

Figure 2:
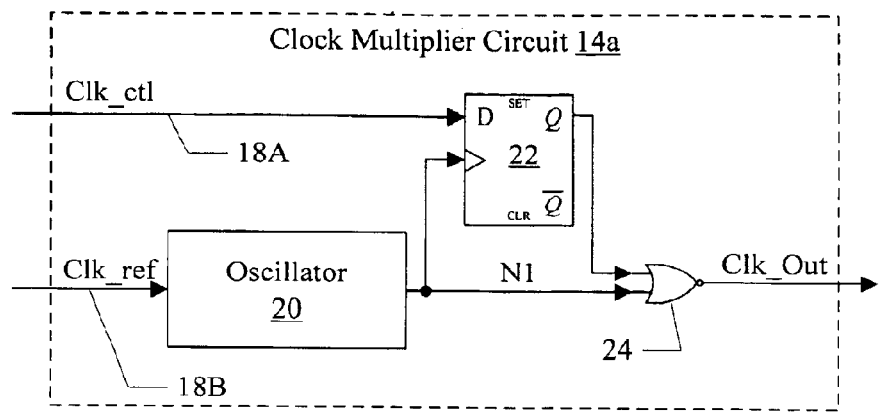
FIG. 2 is a circuit diagram of a first embodiment of the clock multiplier circuit shown in FIG. 1

Turning now to FIG. 2, a circuit diagram of a first embodiment of the clock multiplier circuit 14 (clock multiplier circuit 14a) is shown. In the embodiment of FIG. 2, the clock multiplier circuit 14a includes an oscillator 20, a flop 22, and a NOR gate 24. The flop 22 is coupled to receive a control signal (Clk_ctl) 18A, which is an external input signal to the integrated circuit 10 in this embodiment and is included in the input signals 18 shown in FIG. 1. The oscillator 20 is coupled to receive a reference clock signal (Clk_ref) 18B, which may also be an external input to the integrated circuit 10 and may be included in the input signals 18 shown in FIG. 1. The output of the oscillator 20 (node N1 in FIG. 2) is coupled to the clock input of the flop 22, and is coupled to an input of the NOR gate 24. The output (Q) of the flop 22 is coupled as an input to the NOR gate 24. The output of the NOR gate 24 is the Clk_Out clock signal.

The oscillator 20 may be any circuitry which is configured to generate an oscillating output in response to the Clk_ref clock signal. That is, the output of the oscillator 20 may be a continuous stream of pulses, with a frequency derived from the Clk_ref clock signal. The oscillator 20 may multiply the frequency of the Clk_ref clock signal to produce the output, or may supply an output at the same frequency as the Clk_ref clock signal, as desired. For example, the oscillator 20 may include a PLL. Other embodiments may include other types of oscillators may be used (e.g. free running oscillators (without a Clk_ref input) such as crystal oscillators).

The NOR gate 24 is used to selectively mask the pulses provided by the oscillator 20 to generate the Clk_Out clock signal. In this embodiment, the Clk_ctl control signal is used to mask the Clk_Out clock signal. If the Clk_ctl control signal is high, the pulses are masked. If the Clk_ctl control signal is low, the pulses are not masked (they propagate on the Clk_Out clock signal). Thus, in this embodiment, the ATE 12 may directly control the generation of pulses on the Clk_Out clock signal. Clocking may be stopped by holding the Clk_ctl signal low, and may be restarted by driving the Clk_ctl signal high. The ATE 12 may generate the Clk_ctl control signal based on a theoretical input clock signal (Clk_in in FIG. 3). Alternatively, the Clk_ctl signal may be viewed as having a period (and thus a frequency), and the Clk_Out clock signal may have a selected number of pulses during the period.

The flop 22 receives the Clk_ctl control signal and is clocked by the output of the oscillator 20. The flop 22 thus captures the value of the Clk_ctl control signal responsive to the oscillator output (e.g. responsive to the rising edge of the output of the oscillator 20 on the node N1) and supplies the stored Clk_ctl signal to the NOR gate 24. Since pulses on the Clk_Out clock signal are generated in the low phase on the node N1 (through the NOR gate 24), the flop 22 ensures that changes in the Clk_ctl control signal do not lead to pulses on the Clk_Out clock signal which are narrower than pulses from the oscillator 20. For example, if the Clk_ctl control signal were to transition from high to low during the low phase the node N1, a pulse may be generated on the Clk_Out clock signal from the transition of the Clk_ctl control signal to the next rising edge on the node N1 if the Clk_ctl signal was directly input to the NOR gate 24. Similarly, if the Clk_ctl control signal were to transition from low to high during the low phase, a pulse on the Clk_Out clock signal may be terminated early by the Clk_ctl control signal transition if the Clk_ctl control signal was directly input to the NOR gate 24. The flop 22 ensures that transitions of the stored Clk_ctl control signal occur during the high phase on the node N1, which may not affect pulse width on the Clk_Out clock signal.

Figure 4:
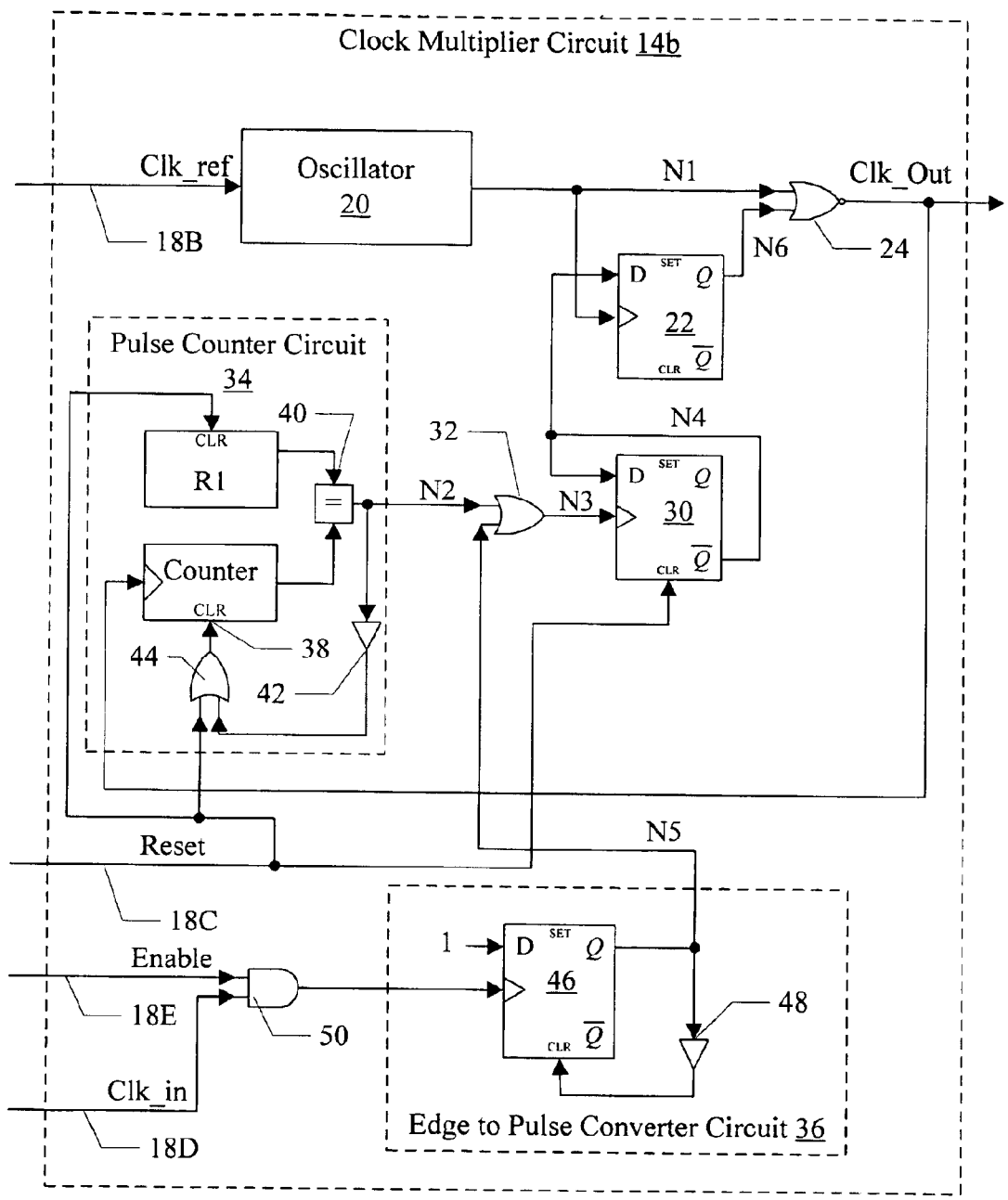
FIG. 4 is a circuit diagram of a second embodiment of the clock multiplier circuit shown in FIG. 1
Figure 6:
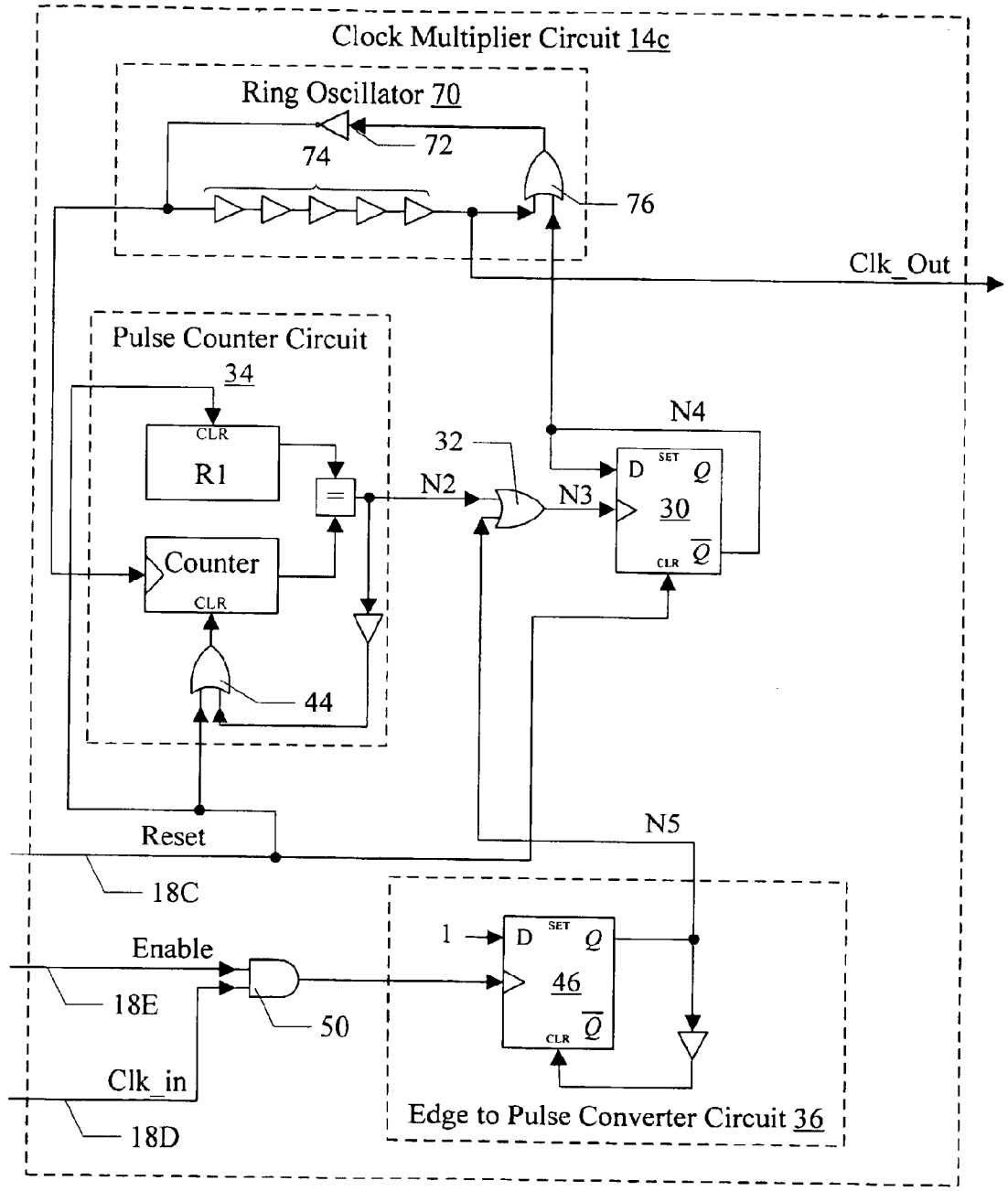
FIG. 6 is a circuit diagram of a third embodiment of the clock multiplier circuit shown in FIG. 1

While a flop 22 is shown in FIG. 2 (and other flops are shown in FIGS. 4 and 6), generally any clocked storage device may be used. A clocked storage device is a storage device which captures a new value to be stored responsive to a clock signal. A clocked storage device may be referred to as "clocked", which refers to the storage device capturing a new value responsive to the clock signal. Clocked storage devices may include flops, registers, latches, etc.

While a NOR gate 24 is shown in FIG. 2, in other embodiments any logic circuit may be used. Different logic circuits may be used, for example, if different levels of the Clk_ctl control signal are used to mask pulses and allow pulses to pass, respectively. Non-inverting gates may be used to pass pulses without inversion, if desired. Additionally, any Boolean equivalents of a given logic gate or logic circuit may be used.

Figure 3:
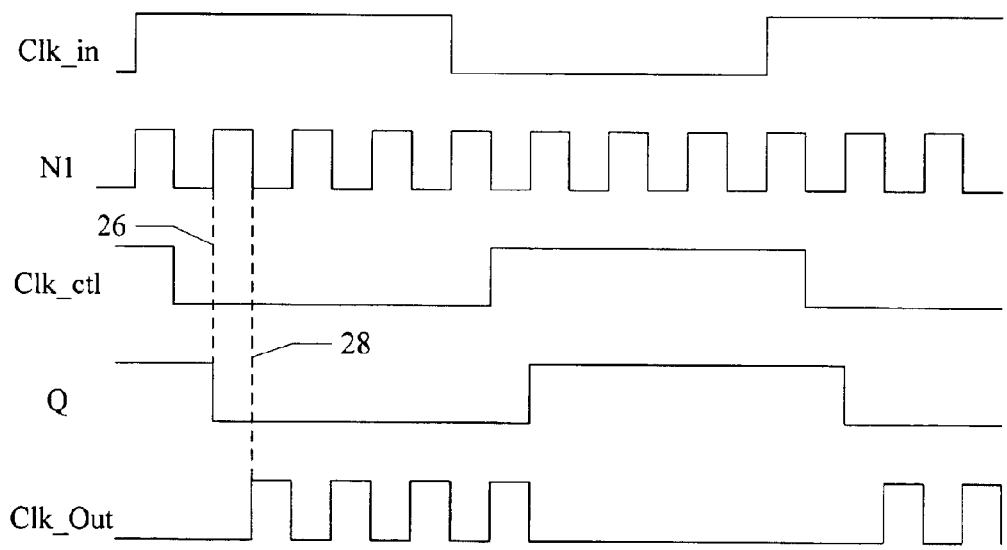
FIG. 3 is a timing diagram illustrating exemplary operation of one embodiment of the clock multiplier circuit shown in FIG. 2.

FIG. 3 is a timing diagram illustrating exemplary operation of one embodiment of the clock multiplier circuit 14*a*. Shown in FIG. 3 is a theoretical Clk_in clock signal for which the ATE 12 is using the clock multiplier circuit 14*a* to multiply the frequency, the node N1, the Clk_ctl control signal, the output (Q) of the flop 22, and the Clk_Out clock signal. In the example of FIG. 3, a clock multiplication of 4 between the Clk_in clock signal and the Clk_Out clock signal is provided. That is, there are four pulses of the Clk_Out clock signal for each Clk_in period. It is noted that combinatorial circuit delays may not have been illustrated in FIG. 3 for simplicity in the drawings (e.g. the delay of the N1 signal through the NOR gate 24 to the pulses on the Clk_Out clock signal may not have been illustrated in FIG. 3).

The ATE 12 may drive the Clk_ctl input low responsive to the rising edge of the Clk_in clock signal, and may hold the Clk_ctl input low long enough to permit the passage of 4 clock pulses from N1 to the Clk_Out clock signal. Responsive to the next rising edge on the N1 node, the flop 22 output Q transitions low (dotted line 26). The N1 input to the NOR gate 24 is high at this point, and thus the Clk_Out clock signal remains low. At the next falling edge on the N1 node (dotted line 28), the NOR gate 24 transitions high (since both its inputs are logical zero). The next four low pulses on the node N1 result in high pulses on the Clk_Out clock signal. Note that the pulse width is controlled by the width of pulses from the oscillator 20, and thus are independent of the Clk_in clock frequency. Furthermore, the width is independent of the number of pulses to be produced (the multiplier ratio). If the multiplier ratio is changed, the amount of time after the pulses have been produced and before the next rising edge of the Clk_in clock signal (in which the Clk_Out clock signal is held steady in a low state, in this example) may be reduced.

The embodiment of FIG. 2 thus produces a burst of pulses on the Clk_Out clock signal during a Clk_in period, followed by a steady state until the next period of the Clk_in clock (based on the control of the Clk_ctl signal). The multiplier ratio is changed in this embodiment by lengthening or shortening the amount of time that the Clk_ctl signal is driven low in each period of the Clk_in clock signal. The frequency of the Clk_in input clock is changed by lengthening or shortening the amount of time between instances of driving the Clk_ctl signal low. Thus, the clock multiplier circuit 14*a* may response to either of these two events rapidly (e.g. the next Clk_in clock period), in some embodiments.

The Clk_in clock is shown in FIG. 3 as a theoretical clock for which clock multiplication may be performed. Viewed in another way, the Clk_ctl signal may be viewed as a signal having a period, and the Clk_Out clock signal may have N pulses during that period (and thus the frequency of the Clk_Out clock signal may be N times the frequency of the Clk_ctl control signal).

The embodiment of FIG. 2 may generate the selected number of pulses on the Clk_Out clock signal responsive to an edge of the Clk_ctl signal. For example, the embodiment of FIG. 2 may generate the selected number of pulse responsive to the falling edge as illustrated (although other embodiments may be responsive to the rising edge, or both edges). In the illustrated embodiment, the rising edge of the Clk_ctl signal selects the number of pulses (although other embodiments may use the falling edge to select the number of pulses).

Turning next to FIG. 4, a circuit diagram of a second embodiment of the clock multiplier circuit 14 (clock multiplier circuit 14*b*) is shown. In the embodiment of FIG. 4, similar to the clock multiplier circuit 14*a*, the clock multiplier circuit 14*b* includes the oscillator 20 coupled to receive the Clk_ref signal 18B and coupled to the node N1, which is coupled as the clock input of the flop 22 and the NOR gate 24. The NOR gate 24 also has an input coupled to the output (Q) of the flop 22 (labeled as node N6 in FIG. 4), and provides the Clk_Out clock signal. The input of the flop 22 (the control signal) is coupled to other circuitry in the clock multiplier circuit 14b. In particular, the control signal may be the inverted output (Q bar) of a flop 30, which also has its inverted output coupled to its input (labeled node N4 in FIG. 4). The clock input of the flop 30 is coupled to an OR gate 32, which has inputs coupled to the output of a pulse counter circuit 34 and an output of an edge to pulse converter circuit 36. The output of the OR gate 32 is labeled node N3. The output of the pulse converter circuit 34 is labeled node N2, and the output of the edge to pulse converter circuit 36 is labeled node N5. The flop 30 includes a reset, or clear (CLR) input coupled to receive a reset signal 18C (part of the signals 18 for this embodiment). In the illustrated embodiment, the pulse counter circuit 34 includes a register R1, a counter 38, a comparator circuit 40, a buffer 42, and an OR gate 44. The register R1 and the counter 38 are coupled to the comparator circuit 40, the output of which is the node N2 and is input to the buffer 42, the output of which is coupled as an input to the OR gate 44. The reset signal 18C is also coupled as a input to the OR gate 44, which is coupled to a CLR input of the counter 38. The reset signal 18C is also coupled to a CLR input of the register RI. In the illustrated embodiment, the edge to pulse converter circuit 36 includes a flop 46 and a buffer 48. The input of the flop 46 is coupled to a logical one, and the output (Q) of the flop 46 is coupled as the input to the buffer 48 and as the output of the edge to pulse converter circuit 36 (the node N5). The output of the buffer 48 is coupled to the CLR input of the flop 46. The clock input of the flop 46 is coupled to the output of an AND gate 50, which has inputs coupled to receive a Clk_in clock signal 18D and an enable signal 18E (both of which may be part of the signals 18 for this embodiment).

The oscillator 20, the flop 22, and the NOR gate 24 may operate in a similar fashion to the like-numbered elements of the clock multiplier circuit 14a with respect to the control signal input to the flop 22 (node N4). The control signal is generated as the inverted output of the flop 30 in this embodiment. At reset, the control signal may be high (causing the Clk_Out clock signal to be in steady state low) in this embodiment (responsive to the assertion of the reset signal 18C on the CLR input of the flop 30). Subsequently, the control signal may alternately toggle low and high responsive to the flop 30 being clocked.

In the illustrated embodiment, two events may cause the flop 30 to be clocked. The first event is a rising edge of the Clk_in clock signal 18D. A rising edge of the Clk_in clock signal 18D (passing through the AND gate 50, assuming the enable signal 18E is asserted) is converted by the edge to pulse converter circuit 36 to a pulse on the node N5, which clocks the flop 30 through the OR gate 32. This clocking causes the inverted output of the flop 30 to transition low. On the next rising edge on the node N1, the low value on the node N4 is clocked into the flop 22 (thus permitting pulses on the Clk_Out clock signal).

The second event is the pulse counter circuit 34 detecting that the selected number of pulses have occurred on the Clk_Out clock signal. The pulse counter circuit 34 is coupled to receive the Clk_Out clock signal, and counts pulses on the Clk_Out clock signal. When the selected number of pulses has been counted, the pulse counter circuit 34 outputs a pulse on the node N2, which clocks the flop 30 through the OR gate 32. This clocking causes the inverted output of the flop 30 to transition high. On the next rising edge on the node N1, the high value on the node N4 is clocked into the flop 22. Subsequent pulses from the node N1 are masked on the Clk_Out clock signal, until the next rising edge on the Clk_in clock signal.

In the illustrated embodiment of the pulse counter circuit 34, pulses are counted by the counter 38. The counter 38 is initialized to zero via the reset signal 18C, and via assertion of output on the node N2 (through the buffer 42 and the OR gate 44). The counter is clocked by the Clk_Out clock signal, and thus increments for each pulse of the Clk_Out clock signal. The selected number of pulses is programmed into the register R1. The programming may occur in any desired fashion. For example, the count may be scanned into the register R1 using a scan interface (e.g. the JTAG interface). The count may be programmed via dedicated pins to the integrated circuit 10, via software, or any other mechanism.

The comparator circuit 40 compares the contents of the register RI to the contents of the counter 38, and asserts its output signal on the node N2 when the contents match. The asserted signal begins the pulse on the node N2. Additionally, the asserted signal flows through the buffer 42 and the OR gate 44 to the CLR input of the counter 38. The counter 38 may clear, thus causing the comparator circuit 40 to detect that the contents of the counter 38 and the register R1 no longer match. The comparator circuit 40 deasserts its output signal in response, completing the pulse on the node N2. Thus, the pulse width may be approximately the sum of the delay of the buffer 42 and the OR gate 44, the delay in the counter clearing in response to the CLR input, and the delay in the comparator 40 detecting the clearing.

The selected pulse count may be programmed into the register R1, and may be changed during a test as well by writing a new count to the register R1. The new count may by written in any desired fashion (e.g. scanning, dedicated pins, software, etc.). If the count is changed, the Clk_Out clock signal may begin operating at the new pulse count within the next clock period of the Clk_in clock signal 18D (and may begin operating in the current clock period, if the count is changed before the Clk_Out clock signal pulses have been completed for the current clock period based on the previous value in the register R1), in some embodiments. If the Clk_in clock signal changes frequency, since the Clk_Out clock signal pulses are generated responsive to an edge on the Clk_in clock signal, the frequency of the Clk_Out clock signal may be rapid, in some embodiments (e.g. the next period of the Clk_in clock signal).

While an embodiment of the pulse counter circuit 34 is shown in FIG. 4, other embodiments are possible. For example, a counter may be loaded with the selected pulse count and may count down to zero responsive to pulses on the Clk_Out clock signal. Generally, a pulse counter circuit may comprise any circuit coupled to receive a signal and count pulses on the signal. The pulse counter circuit may be configured to output a signal when the count reaches a selected count (either fixed or programmable).

In the illustrated embodiment, the edge to pulse converter circuit 36 may comprise the buffer 48 and the flop 46 clocked by the Clk_in clock signal 18D. The output (Q) of the flop 46 may change to a binary one in response to being clocked, and the buffer 48 may route the binary one to the CLR input of the flop 46. The flop 46 may clear in response to the binary one of the CLR input. Thus, the pulse width of the pulse from the edge to pulse converter circuit 36 may be approximately the delay of the buffer 48 and the delay in clearing the flop 46 in response to the CLR input. Other embodiments are possible. For example, a combinatorial circuit may include an AND gate coupled to receive the Clk_in clock signal and an inverted Clk_in clock signal (e.g. delayed through an odd number of inverters). The AND gate may output a pulse responsive to the rising edge of the Clk_in clock signal. The width may be approximately the delay of the inverters. Generally, an edge to pulse converter circuit may include any circuitry which converts an edge of a signal to a pulse.

The pulse widths of the edge to pulse converter circuit 36 and the pulse counter circuit 34 may be set to meet or exceed the timing requirements of the flop 30, in one embodiment. In some embodiments, the rising edges of the Clk_ref signal 18B and the Clk_in signal 18D may be correlated to meet the timing requirements (e.g. setup and hold) of the flop 22, taking into account delays through the oscillator 20 (for the Clk_ref signal 18B) and the edge to pulse converter circuit 36, NOR gate 32, and flop 30 (for the Clk_in signal 18D). In the embodiment of FIG. 4, the clock multiplier circuit 14*b* is multiplying the frequency of the Clk_in clock signal. Changes in the frequency of the input clock signal may be accomplished by changing the frequency of the Clk_in clock signal, in this embodiment. The Clk_ref clock signal may have a relatively stable frequency, in this embodiment.

While the flop 30 is defined to include an inverted (Q bar) output, other embodiments may realize flop 30 using a flop with a non-inverted output and an inverter, if desired. As mentioned above with respect to FIG. 2, while flops 22, 30, and 46 are shown in FIG. 4, any clocked storage devices may be used in other embodiments. Furthermore, other embodiments may generate Clk_Out clock pulses in response to the falling edge of the Clk_in clock signal 18D, or in response to both rising and falling edges, as desired.

It is noted that, while an enable signal 18E is used to selectively mask the Clk_in signal 18D in the present embodiment, other embodiments may exclude the enable signal 18E and the AND gate 50 may be eliminated. While NOR gate 24, OR gate 32, OR gate 44, and AND gate 50 are illustrated in FIG. 4, in other embodiments any logic circuit may be used. Different logic circuits may be used, for example, if the definitions of the high and low values of the input signals to the gates are changed. Additionally, any Boolean equivalents of a given logic gate or logic circuit may be used.

Figure 5:
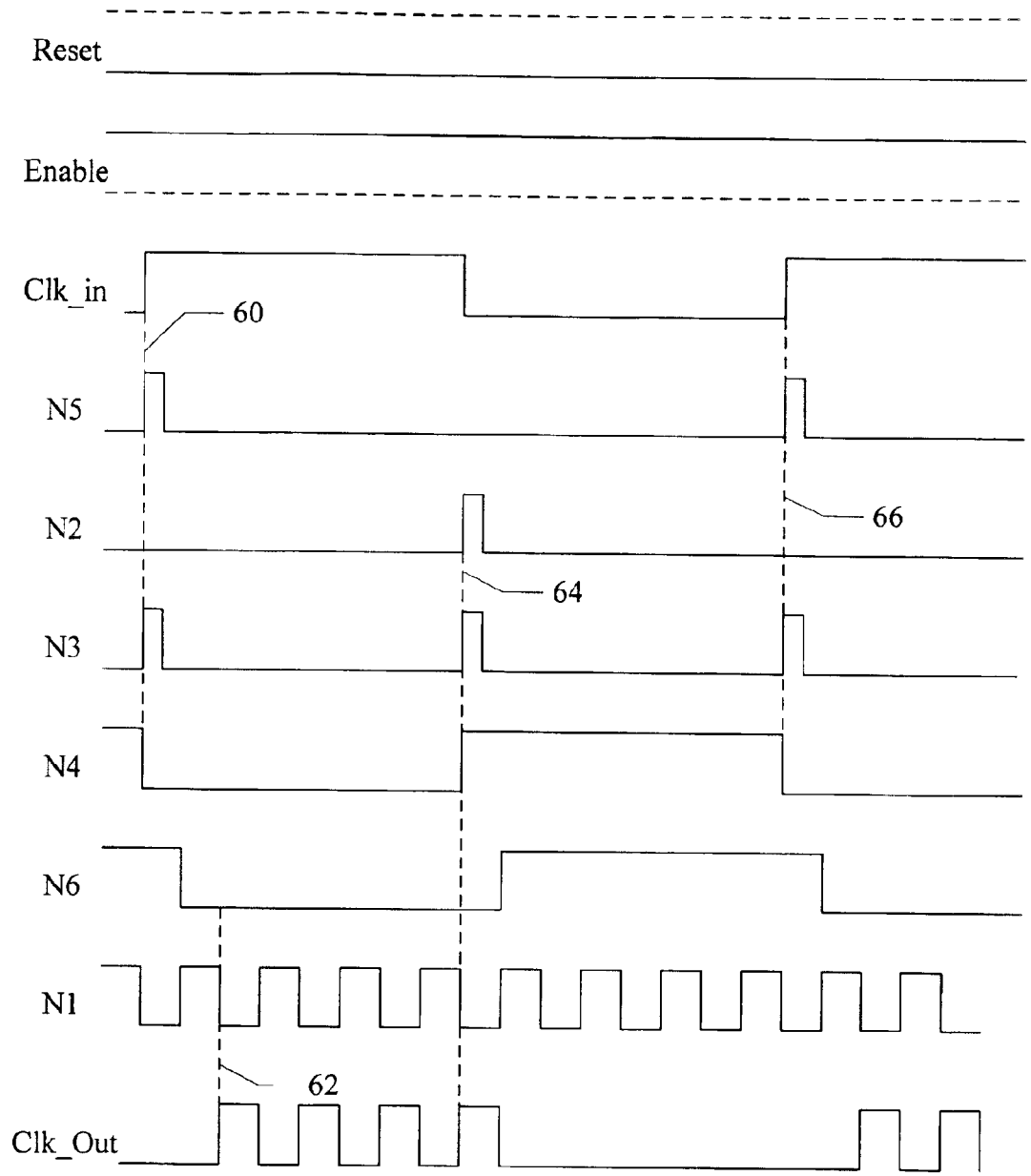
FIG. 5 is a timing diagram illustrating exemplary operation of one embodiment of the clock multiplier circuit shown in FIG. 4.

Turning now to FIG. 5, a timing diagram illustrating exemplary operation of one embodiment of the clock multiplier circuit 14*b* for a clock multiplier of four is shown. The reset signal 18B, the enable signal 18E, the Clk_in clock signal 18D, and the Clk_Out clock signal are shown in FIG. 5. Additionally, the nodes N1–N6 are illustrated in FIG. 5 as well. It is noted that combinatorial circuit delays in the circuits of FIG. 4 may not have been illustrated in FIG. 5 for simplicity in the drawings.

The timing diagram shown in FIG. 5 begins after reset has occurred and the clock multiplier 14*b* has been enabled. Thus, the reset signal is a constant low and the enable signal is a constant high in the timing diagram. Generally, the reset signal may be asserted (high in this case) to reset the integrated circuit 10, including those storage devices in FIG. 4 which receive the reset signal. The reset signal may be deasserted, and then the enable may be asserted. The Clk_in clock signal may then begin toggling.

In response to the rising edge of the Clk_in clock signal, the edge to pulse converter circuit 36 generates a pulse on the node N5 (dotted line 60). The pulse on the node N5 results in a corresponding pulse on the node N3, which toggles the N4 node from high to low. On the next rising edge of the node N1, the flop 24 captures the low state from the node N4 and provides the low state on the node N6. On the next falling edge of the node N1 (dotted line 62), with the node N6 low, a pulse is generated on the Clk_Out signal. Pulses continue to be generated, and are counted by the pulse counter circuit 34. In response to the fourth pulse (since a multiplier ratio of four is selected in this example), the pulse counter circuit 34 outputs a pulse on the node N2 (dotted line 64). The pulse results in a pulse on the node N3, which causes the node N4 to toggle from low to high. On the next rising edge of the N1, the flop 22 captures the high state on the node N4 and provides the high state on the node N6. Subsequent pulses on the node N1 are masked, until the next rising edge of the Clk_in clock signal causes another transition on the node N4 (and subsequently N6) (dotted line 66).

Turning next to FIG. 6, a third embodiment of the clock multiplier circuit 14 (clock multiplier circuit 14*c*) is shown. The embodiment of FIG. 6 includes the pulse counter circuit 34, the edge to pulse converter circuit 36, the AND gate 50, the OR gate 32, and the flop 30 similar to the clock multiplier circuit 14*b*. Additionally, the clock multiplier circuit 14*c* includes a ring oscillator 70. The ring oscillator 70 is configured to output the Clk_Out clock signal and is coupled to receive the control signal (node N4) as an input. Furthermore, the ring oscillator is configured to output a clock signal for the counter 38 in the pulse counter circuit 34. The clock signal may be an earlier or later version of the Clk_Out clock signal, or may be the Clk_Out clock signal, as desired.

Generally, the AND gate 50, the edge to pulse converter circuit 36, the pulse counter circuit 34, the OR gate 32, and the flop 30 may operate in a manner similar to the same circuitry shown in FIG. 4 to generate the control signal on the node N4. In the embodiment of FIG. 6, the control signal on the node N4 may control whether or not the ring oscillator 70 oscillates. Generally, a ring oscillator may comprise two or more stages coupled in a ring, wherein an odd number of the stages are inverting. A signal propagating around the ring is inverted an odd number of times, which causes the signal, when it returns to the same point in the ring, to have the opposite binary state than it had the previous time around the ring. Thus, oscillation occurs. The width of the oscillation pulses may be based on the delay around the ring. In the present embodiment, the ring oscillator 70 may be designed to generate a pulse width large enough for the circuitry receiving the Clk_Out clock signal to be able to operate within the period of the Clk_Out signal.

In the illustrated embodiment, for example, the ring oscillator 70 may include an inverter 72 as one stage, a set of buffers 74 coupled in series forming additional stages, and an OR gate 76 forming another stage. The inverter 72 has an input coupled to the output of the OR gate 76 and an output coupled to the input of the series connection of buffers 74. The output of the series connection of buffers 74 is coupled as an input to the OR gate 76, which is also coupled to receive the control signal on the node N4 as an input. If the control signal on the node N4 is low, the OR gate 76 passes the output of the buffers 74 to the input of the inverter 72. If the control signal on the node N4 is high, the feedback around the ring is broken, and the Clk_Out clock signal may be steady state (e.g. low in this embodiment).

While OR gate 70, OR gate 32, OR gate 44, and AND gate 50 are illustrated in FIG. 6, in other embodiments any logic circuit may be used. Different logic circuits may be used, for example, if the definitions of the high and low values of the input signals to the gates are changed. Additionally, any Boolean equivalents of a given logic gate or logic circuit may be used. As mentioned above with respect to FIG. 2, while flops 30 and 46 are shown in FIG. 4, any clocked storage devices may be used in other embodiments. Furthermore, other embodiments may generate Clk_Out clock pulses in response to the falling edge of the Clk_in clock signal 18D, or in response to both rising and falling edges, as desired.

Figure 7:
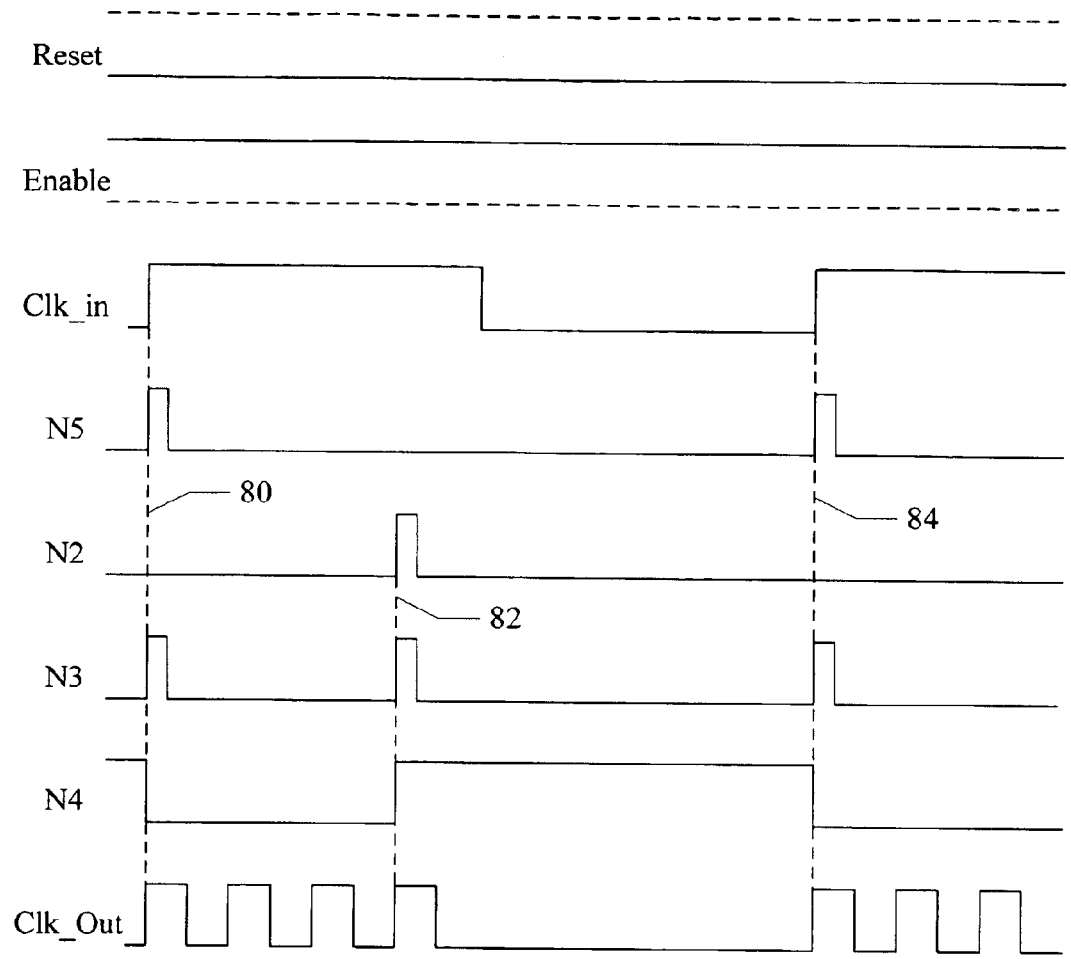
FIG. 7 is a timing diagram illustrating exemplary operation of one embodiment of the clock multiplier circuit shown in FIG. 6.

Turning now to FIG. 7, a timing diagram illustrating exemplary operation of one embodiment of the clock multiplier circuit 14c for a clock multiplier of four is shown. The reset signal 18B, the enable signal 18E, the Clk_in clock signal 18D, and the Clk_Out clock signal are shown in FIG. 7. Additionally, the nodes N2–N5 are illustrated in FIG. 7 as well. It is noted that combinatorial circuit delays in the circuits shown in FIG. 6 may not have been illustrated in FIG. 7 for simplicity in the drawings.

The timing diagram shown in FIG. 7 begins after reset has occurred and the clock multiplier 14c has been enabled. Thus, the reset signal is a constant low and the enable signal is a constant high in the timing diagram. Generally, the reset signal may be asserted (high in this case) to reset the integrated circuit 10, including those storage devices in FIG. 6 which receive the reset signal. The reset signal may be deasserted, and then the enable may be asserted. The Clk_in clock signal may then begin toggling.

In response to the rising edge of the Clk_in clock signal, the edge to pulse converter circuit 36 generates a pulse on the node N5 (dotted line 80). The pulse on the node N5 results in a corresponding pulse on the node N3, which toggles the N4 node from high to low. Toggling the N4 node from high to low enables the ring oscillator 70, which begins oscillating and thus pulses on the Clk_Out signal begin occurring. The pulses are counted by the pulse counter circuit 34. In response to the fourth pulse (since a multiplier ratio of four is selected in this example), the pulse counter circuit 34 outputs a pulse on the node N2 (dotted line 82). The pulse results in a pulse on the node N3, which causes the node N4 to toggle from low to high. The toggling of the node from low to high disables the ring oscillator on the next transition of the Clk_Out signal from high to low. The ring oscillator 70 remains disabled until the next rising edge of the Clk_in clock signal causes another transition on the node N4 (dotted line 84).

Turning next to FIG. 8, a block diagram of a computer accessible medium 300 including one or more data structures representative of the circuitry included in the integrated circuit 10 is shown. Generally speaking, a computer accessible medium may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Generally, the data structure(s) of the circuitry on the computer accessible medium 300 may be read by a program and used, directly or indirectly, to fabricate the hardware comprising the circuitry. For example, the data structure(s) may include one or more behavioral-level descriptions or register-transfer level (RTL) descriptions of the hardware functionality in a high level design language (HDL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium 300 may be the netlist(s) (with or without the synthesis library) or the data set(s), as desired. In yet another alternative, the data structures may comprise the output of a schematic program, or netlist(s) or data set(s) derived therefrom.

While computer accessible medium 300 includes a representation of the integrated circuit 10, other embodiments may include a representation of any portion of the integrated circuit 10 (e.g. any of clock multiplier circuits 14a–14c, core 16, portions of the clock multiplier circuits 14a–14c, etc.).

Numerous variations and modifications will become apparent to those skilled in the art once the above disclosure is fully appreciated. It is intended that the following claims be interpreted to embrace all such variations and modifications.

What is claimed is:

1. A clock circuit comprising:

an oscillator to receive a reference clock signal and to generate pulses having a frequency which is greater than that of a frequency of the reference clock signal;

a latching device coupled to receive a clock control signal that is used to mask a clock output signal, the latching device also coupled to receive the pulses from the oscillator to synchronize the clock control signal with the pulses from the oscillator for output from the latching device;

a logic gate counted to receive the synchronized clock control signal output from the latching device and also to receive the pulses from the oscillator and to output pulses from the oscillator as the clock output signal, but to mask the clock output signal if the clock control signal indicates a masked condition, the synchronizing of the clock control signal and the pulses from the oscillator to maintain constant pulsewidth of the pulses of the clock output signal independent of timing of the clock control signal; and a pulse counter circuit coupled to receive and count pulses of the clock output signal and to indicate when a selected number pulses of the clock output signal has occurred to initiate the masked condition of the clock control signal.

2. The clock circuit of claim 1 wherein the pulse counter circuit includes a register to store a value to determine the selected number of pulses to be output for the clock output signal.

3. A method comprising:

generating pulses having a frequency which is greater than a frequency of a reference clock signal;

generating a control signal in response to a state change of the reference clock signal;

synchronizing the pulses and the control signal;

outputting a selected number of the pulses as a clock output signal when the control signal indicates an unmasked condition, the synchronizing of the control signal to the pulses maintains constant pulsewidth of the pulses of the clock output signal independent of a number of pulses selected for output; and counting a number of pulses of the clock output signal to initiate a change in the control signal to indicate a masked condition to mask output of the clock output signal alter the selected number of the pulses have been output.

4. The method as recited in claim 3 further comprising programming a register with a value to set the selected number of pulses to be counted.

5. A clock circuit comprising:

a ring oscillator to output a series of pulses having a frequency which is greater than that of a frequency of a reference clock signal, some of the pulses of the series of pulses from the ring oscillator to be output as a clock output signal;

a latching circuit to receive a command pulse and to generate a control signal to the ring oscillator to commence oscillating to output the clock output signal;

a logic gate to receive a start pulse at a first input terminal and a stop signal at a second input terminal and to generate the command pulse; and a counter circuit coupled to receive and count the series of pulses and to generate the stop signal to the logic gate to change a state of the control signal to cause the ring oscillator to stop output of the series of pulses after a selected number of pulses are output from the ring oscillator, wherein the start pulse is generated by the reference clock signal to synchronize the start of the ring oscillator to the reference clock signal.

6. The clock circuit of claim 5 wherein the counter circuit is a pulse counter circuit that selects a number of pulses to be output from the ring oscillator.

7. The clock circuit of claim 6 wherein the pulse counter circuit includes a register to store a value to determine the number of pulses to be selected for output by the ring oscillator.

8. The clock circuit of claim 5 wherein a width of the pulses output from the ring oscillator is determined by a delay time around a circuit ring of the ring oscillator.

* * * * *

UNITED STATES PATENT AND TRADEMARK OFFICE
CERTIFICATE OF CORRECTION

PATENT NO. : 6,914,459 B2  Page 1 of 1
APPLICATION NO. : 10/857817
DATED : July 5, 2005
INVENTOR(S) : Haluk Konuk et al.

It is certified that error appears in the above-identified patent and that said Letters Patent is hereby corrected as shown below:

Column 13, line 6, in Claim 3: replace "alter" with --after--.

Signed and Sealed this

Twenty-third Day of December, 2008

JON W. DUDAS
*Director of the United States Patent and Trademark Office*